United States Patent
Kientz et al.

(10) Patent No.: US 12,353,771 B2
(45) Date of Patent: *Jul. 8, 2025

(54) CHARGE LOSS MITIGATION THROUGHOUT MEMORY DEVICE LIFECYCLE BY PROACTIVE WINDOW SHIFT

(71) Applicant: Micron Technolgy, Inc., Boise, ID (US)

(72) Inventors: Steven Michael Kientz, Westminster, CO (US); Ugo Russo, Boise, ID (US); Vamsi Pavan Rayaprolu, San Jose, CA (US)

(73) Assignee: Micron Technolgy, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/618,946

(22) Filed: Mar. 27, 2024

(65) Prior Publication Data
US 2024/0241672 A1    Jul. 18, 2024

Related U.S. Application Data

(63) Continuation of application No. 17/579,230, filed on Jan. 19, 2022, now Pat. No. 11,977,774.

(60) Provisional application No. 63/292,132, filed on Dec. 21, 2021.

(51) Int. Cl.
G06F 3/06    (2006.01)

(52) U.S. Cl.
CPC .......... *G06F 3/0659* (2013.01); *G06F 3/0604* (2013.01); *G06F 3/0679* (2013.01)

(58) Field of Classification Search
CPC .... G06F 3/0679; G06F 3/0688; G06F 3/0614; G06F 3/0619; G06F 3/0655; G06F 3/0652
See application file for complete search history.

(56) References Cited

U.S. PATENT DOCUMENTS

| | | |
|---|---|---|
| 2014/0082460 A1 | 3/2014 | Pangal et al. |
| 2014/0119113 A1 | 5/2014 | Xia et al. |
| 2015/0036428 A1 | 2/2015 | Liu |
| 2016/0103630 A1 | 4/2016 | Shen |
| 2016/0307633 A1 | 10/2016 | Lee |
| 2016/0342347 A1 | 11/2016 | Duzly et al. |
| 2019/0012228 A1 | 1/2019 | Hsiao et al. |
| 2020/0133754 A1 | 4/2020 | Sheperek et al. |
| 2022/0406380 A1 | 12/2022 | Penzo et al. |

*Primary Examiner* — Tracy A Warren
(74) *Attorney, Agent, or Firm* — Lowenstein Sandler LLP

(57) ABSTRACT

One or more trim values associated with a set of blocks of a memory device are set according to a representative number of program erase cycles (PECs) for the set of blocks. Each block in the set of blocks was programmed within at least one of a specified time window or a specified temperature range. Responsive to executing a program operation on a block of the set of blocks according to the one or more trim values, an indicator is set to reflect the one or more trim values used during the execution of the program operation. Responsive to receiving a request to perform a read operation directed to the block of the set of blocks, a read offset value corresponding to the indicator is determined. The read operation is performed using the read offset value.

20 Claims, 7 Drawing Sheets

| Trim Name 212 | AvgPEC < 30 214 | 30 <= AvgPEC < 1,000 216 | AvgPEC >= 1,000 218 |
|---|---|---|---|
| Writing Trim Set | 1 | 2 | 0 |
| Base Level 1 | -40 | -20 | 0 |
| Base Level 2 | -35 | -20 | 0 |
| Base Level 3 | -35 | -20 | 0 |
| Base Level 4 | -35 | -20 | 0 |
| Base Level 5 | -30 | -20 | 0 |
| Base Level 6 | -30 | -20 | 0 |
| Base Level 7 | -25 | -2 | 0 |
| Erase Trims | -3 | -2 | 0 |
| Vpgm Trims | -3 | ... | ... |
| ... | | | |
| Additional Trims | | | |

| SuperBlock 232 | Block Family 234 | WritingTrimSet 236 | Avg PEC 238 |
|---|---|---|---|
| 0 | 1 | 1 | 25 |
| 1 | 1 | 1 | 25 |
| 2 | 1 | 2 | 32 |
| 3 | 2 | 1 | 27 |
| 4 | 2 | 1 | 29 |
| 5 | 2 | 2 | 30 |
| 6 | 2 | 1 | 20 |
| 7 | 2 | 2 | 36 |
| 8 | 3 | 2 | 33 |
| 9 | 6 | 2 | 34 |
| ... | ... | ... | ... |
| 555 | 26 | 0 | 1,000 |

CHARGE LOSS MITIGATION THROUGHOUT MEMORY DEVICE LIFECYCLE BY PROACTIVE WINDOW SHIFT

CROSS-REFERENCE TO RELATED APPLICATION

This application is a continuation of, and claims priority to, U.S. patent application Ser. No. 17/579,230, filed on Jan. 19, 2022, titled "Charge Loss Mitigation Throughout Memory Device Lifecycle by Proactive Window Shift," which claims the benefit under 35 U.S.C. § 119(e) of U.S. Provisional Patent Application No. 63/292,132, titled "Charge Loss Mitigation Throughout Memory Device Lifecycle by Proactive Window Shift," filed on Dec. 21, 2021, the entire disclosure of which are incorporated herein by reference.

TECHNICAL FIELD

Embodiments of the disclosure relate generally to memory sub-systems, and more specifically, relate to charge loss mitigation throughout the memory device lifecycle by proactive window shift.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
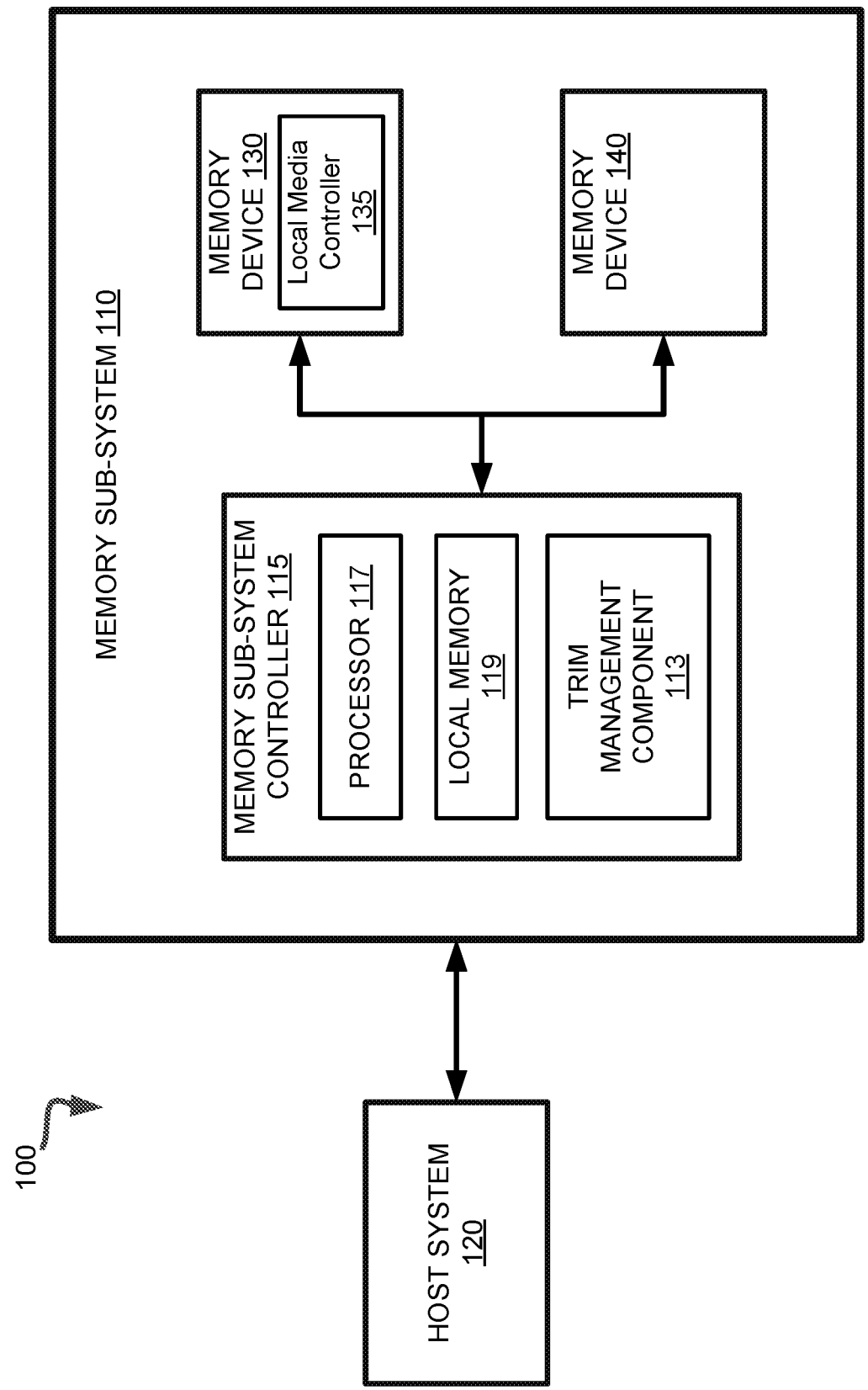
FIG. 1 illustrates an example computing system that includes a memory sub-system in accordance with some embodiments of the present disclosure.

Aspects of the present disclosure are directed to charge loss mitigation throughout memory device lifecycle by proactive window shift. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell, thus allowing modulation of the voltage distributions in the memory device. Moreover, precisely controlling the amount of the electric charge stored by the memory cell allows for multiple threshold voltage levels corresponding to different logical levels, thus effectively allowing a single memory cell to store multiple bits of information. For example, a memory cell operated with $2^n$ different threshold voltage levels is capable of storing n bits of information. Thus, the read operation can be performed by comparing the measured voltage exhibited by the memory cell to one or more reference voltage levels in order to distinguish between two logical levels for single-level cells and between multiple logical levels for multi-level cells.

Various physical phenomena and operational processes, such as charge loss and read disturb, can affect the data retention of a memory device. Data retention is a measure of how long data can be retained in the memory sub-system. Charge loss is a phenomenon where the threshold voltage of a memory cell changes as the electric charge of the memory cell is degrading over time and/or as a result of being subjected to a high temperature. The higher the intrinsic voltage level placement, the faster the charge loss. Read disturb can also have a negative impact on data retention. Read disturb is a phenomenon where reading data from a memory cell can cause the threshold voltage of unread memory cells in the same block to shift to a different value. Read disturb can also cause L0 charge gain. In memory cells that include multiple threshold voltage levels, the distribution between the first level (L0) and the second level (L1) can gradually shift as more read operations are performed on the memory cell, causing higher bit error rates.

Charge loss can have a stronger negative impact on data retention at the beginning of life of a memory device, i.e., when the number of program erase cycles (PECs) for the memory device is low. As the memory device progresses in its lifecycle (i.e., as the number of PECs increases), data retention may be less effected by the charge loss phenomenon and may be more effected by read disturb. For example, as a memory device nears end of life, L0 charge gain may be the leading cause of error rates associated with the memory device. Failure to mitigate both charge loss and the read disturb (e.g., L0 charge gain) can result in poor data retention for a memory device. In conventional memory sub-systems, data retention is optimized based on end of life measurements. As a result, the default threshold voltage placements and/or other trims applied to improve data retention may address the effects of read disturb, however they fail to address the charge loss that occurs near the beginning of life of the memory device. The failure of conventional memory sub-systems to address both the charge loss caused by time and temperature and the charge gain caused by read disturb results in poor data retention throughout the lifecycle of the memory device.

Aspects of the present disclosure address the above-noted and other deficiencies by having a memory sub-system that can proactively adjust the programming voltage and other trims associated with writing and reading data to improve data retention throughout the lifecycle of a memory device. The memory sub-system controller can address charge loss, which can have a negative effect data retention near the beginning of life, by shifting the voltage threshold placements applied to memory cells to higher values. Then, as read disturb mechanisms cause charge gain as the lifecycle of the memory device progresses, the memory sub-system controller can gradually shift the programming voltage and other trims back toward the default values.

In embodiments, the memory sub-system controller can identify an average PEC count for a memory device, and apply appropriate program voltage and trims to optimize data retention. The memory sub-system controller can shift the program voltage and trims to higher values near the beginning of life to mitigate the charge loss that occurs at low PEC counts. As the average PEC count for the memory device increases, the memory sub-system can adjust the program voltage and/or trims to a lesser shift value. The memory sub-system controller can maintain a data structure to mark the shift values applied to the data written to the blocks of the memory device. During a read operation, the memory sub-system controller can use the data structure to determine a read offset to apply to the data stored in the memory device to match the program voltage and other trims applied during the write operation.

Advantages of the present disclosure include, but are not limited to, improved data retention, thus improving the overall performance and quality of service of the memory sub-system. By proactively shifting the trims throughout the lifecycle of the memory device, aspects of the present disclosure enable data to be stored for long periods of time with low error rates associated with retrieving the data. Lower error rates can result in an increased reliability of data stored at the memory sub-system, resulting in an improvement of performance and a decrease in power consumption of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a trim management component 113 that can proactively shift the programming voltage and/or trims associated with storing data to mitigate charge loss throughout the lifecycle of memory devices. In some embodiments, the memory sub-system controller 115 includes at least a portion of the trim management component 113. In some embodiments, the trim management component 113 is part of the host system 120, an application, or an operating system. In other embodiments, local media controller 135 includes at least a portion of trim management component 113 and is configured to perform the functionality described herein.

In order to improve data retention, the trim management component 113 can shift the programming voltage and/or other trims associated with executing write operations directed to memory devices in the memory sub-system (e.g., memory device 130). The programming voltages and/or other trims can be shifted based on the average number of program erase cycles (PECs) for the memory sub-system 110. In some embodiments, the trim management component 113 can adjust the programming voltages and/or other trim values based on a minimum or maximum number of PECs, rather than an average number of PECs. For example, the trim management component 113 can adaptively shift the trim values once a block or memory device within the memory sub-system reaches a minimum PEC value, or a maximum PEC value.

The memory sub-system controller 115 can maintain a count of the number of PECs performed for each block, group of blocks, and/or memory devices within the memory sub-system 110, and can determine an average number of PECs for a memory device 130 and/or for the memory sub-system 110 as a whole. The trim management component 113 can then identify the average number of PECs. A program erase cycle (PEC) includes erasing data from a group of memory cells and subsequently programming the group of memory cells with new data. A PEC can be performed on a block or on a group of blocks in a memory device. In some embodiments, the programming voltages and/or other trims can be shifted based on the average number of PECs for a memory device 130 within the memory sub-system 110, or for a group of blocks within a memory device 130. For example, memory sub-system 110 can use a striping scheme to distribute data throughout a subset of dies of a memory device 130. A set of blocks distributed across a set of dies of a memory device using a striping scheme can be referred to as a "superblock." Hence, the trim management component 113 can determine an average number of PECs for each superblock of a memory device.

Based on the identified average number of PECs, the trim management component 113 can set the programming voltages and/or other trim values to appropriate sets of values to improve data retention throughout the lifecycle of the memory device. In embodiments, the trim management component 113 can maintain a data structure that lists sets of program voltages and/or write trims (e.g., writing trim levels) according to average PEC count. An example of such a data structure is described with regard to FIG. 2A. The data structure can include program voltage values and other writing trim values associated with ranges of average PEC counts. Thus, the trim management component 113 can set the programming voltage and/or other trim values to the values in the data structure associated with the current average PEC count. For example, the first data structure can list three sets of program voltage and other trim values according to three ranges of average PEC count values. The first set of values can be used for an average PEC count of less than 30, the second set of values can be used for an average PEC count of between 30 and 1,000, and the third set of values can be used for an average PEC count of above 1,000. It should be noted that any number of sets of values can be used according to any number of ranges of average PEC counts.

In some embodiments, the sets of values can be associated with a single threshold number. For example, the programming voltage and/or other trim values can be adjusted if the average PEC count is below a predetermined threshold value (e.g., 40 PECs), and the programming voltage and/or other trim values can not be adjusted if the average PEC count is greater than or equal to the predetermined threshold value. In some embodiments, the sets of values can be shifted every x number of PECs. For example, the trim management component 113 can set the initial programming voltages and/or other trim values to a high value when the average number of PECs is below a certain value (e.g., below 30), and can gradually adjust the programming voltages and/or other trim values every x number of PECs.

The set of values can include programming voltage levels for each threshold distribution of the memory cell. For example, for a triple level cell (TLC), the set of values can include a programming voltage shift to apply to each of the voltage levels of the memory cell (e.g., levels 1 through 7, where level 0 is reserved for the erase distribution). The set of values can further include erase trims, and other trim values used when executing write operations to the memory sub-system.

When the memory sub-system 110 receives a write request directed to a memory device (e.g., memory device 130), the trim management component 113 can execute the write request using the set of values associated with the average number of PECs. The trim management component 113 can update a second data structure to mark the set of values used when executing the write request. An example such second data structure is described with regard to FIG. 2B. The second data structure can list the blocks, groups of blocks, and/or sets of blocks. When the trim management component 113 executes a write request directed to a particular block (or group of blocks or set of blocks), the trim management component 113 can update the second data structure to indicate the set of program voltage and/or trim values used in the write request execution. The set of values can reference the first data structure, which lists the values for each set.

When the memory sub-system 110 receives a read request directed to a set of blocks of a memory device, the trim management component 113 can use the indicators stored in the second data structure to determine the appropriate read offsets (e.g., a read level offset) to apply. That is, upon receiving a read request directed to a block within a memory device 130, the trim management component 113 can identify the indicator in the second data structure that indicates the set of values that were used when writing data to the block. The trim management component 113 can then determine the appropriate read offsets to apply to the read command to offset the program voltage and/or other trim values associated with the set of values in the first data structure. The trim management component 113 can then apply the appropriate read offsets when executing the read request. Further details with regards to the operations of the trim management component 113 are described below.

Figure 2A:
FIGS. 2A-2B illustrate example data structures maintained by a trim management component, in accordance with some embodiments of the present disclosure.
Figure 2B:

FIGS. 2A-2B illustrate example data structures 210, 230 maintained by the trim management component 113, in accordance with some embodiments of the present disclosure. In embodiments, data structures 210, 230 can be combined into one data structure, or can be split into additional data structures. In some implementations, data structures 210 and/or 230 can be tables. Data structures 210 and/or 230 can be stored in persistent memory within the memory sub-system, for example in memory device 130. In some embodiments, data structures 210 and/or 230 can be stored in local memory 119 of FIG. 1 and can be generated upon powering on the memory sub-system.

Referring to FIG. 2A, data structure 210 illustrates three sets of writing trim values that the trim management component 113 can use at various average PEC count values. Data structure 210 illustrates trims for a TLC memory device, however it should be noted that the disclosure is not limited to TLC memory devices. Trim name 212 lists the trims that can be applied during a write operation for a TLC memory device, which can include base level trims for threshold distributions 1 through 7, an erase trim, a programming voltage trim, and other additional trims. As illustrated in FIG. 2A, the trims values are DACs, where on DAC can represent 10 millivolts. The trim values can be applied in additional to other existing trim values and/or programming voltages used by the memory sub-system.

In some embodiments, the programming voltages and/or other trims can be shifted based on the average number of PECs for a memory sub-system 110 as a whole, for a memory device 130 within the memory sub-system 110, or for a group of blocks within a memory device 130. For example, memory sub-system 110 can use a striping scheme to distribute data throughout a subset of dies of a memory device 130. A set of blocks distributed across a set of dies of a memory device using a striping scheme can be referred to as a "superblock." Hence, the trim management component 113 can determine an average number of PECs for each superblock of a memory device.

The first writing trim set "1" illustrated in column 214 can be applied when the average number of PECs is less than 30. For example, if the trim management component 113 determines that the average number of PECs is 25, the trim management component 113 can apply a value of −40 DACs for a write operation directed to base level 1 of a memory cell. To continue the example, at an average PEC of 25, the trim management component 113 can apply a value of −25 DACs to a write operation directed to a base level 7 of a memory cell. The trim management component 113 can indicate in a second data structure (e.g., data structure 230 illustrated in FIG. 2B) which writing trim set was used in executing the write operations directed to the block. That is, the trim management component 113 can indicate that writing trim set "1" was used to execute a write operation on the block.

The second writing trim set "2" illustrated in column 216 can be applied when the average PEC of the memory device is greater than or equal to 30 and less than 1,000. For example, if the trim management component 113 determines that average PEC is 500, the trim management component 113 can apply a value of −20 DACs to a write operation directed to base level 3 of a memory cell. The trim management component 113 can update the indicator in data structure 230 to indicate that writing trim set "2" was used to write data to the block.

In some embodiments, the trim management component 113 can set the trim values listed in column 212 upon power on according to the average PEC count, and can adjust the trim values at certain time intervals. That is, the trim management component 113 can identify the average PEC count for a memory device every hour, every few hours, or once a day (or at some other time interval) and set the trim values according to the identified average PEC count.

Once the average PEC count has reached the writing trim set "0," illustrated in column 218 (i.e., the average PEC is greater than or equal to 1,000), the default trim values can be used and the trim management component 113 can determine no longer to apply any trims to write operations. The default trim values for memory sub-systems may be configured to optimize data retention at end of life. Hence, as the lifecycle of the memory sub-system progresses (i.e., the average PEC is greater than 1,000), the trim management component 113 no longer needs to apply additional trims to optimize data retention.

In some embodiments, the trim values illustrated in data structure 210 are relative to the default values. Hence, as a memory device transitions from an average PEC count of 29 to an average PEC count of 30, the trim management component 113 adjusts the trim values to the values listed in column 216 relative to the default values, rather than relative to the previous trim values listed in column 214. As such, as the memory device transitions between writing trim sets, the trim management component 113 can adjust the trim values back to the default setting before applying the updated trim values listed in column 216. For example, as the average PEC count increases to 30, the trim management component 113 can set the trim value for base level 2 to "−20" relative to the default values, rather than adding a trim value of "−20" to the trim value of "−35" for base level 2 set by writing trim set 1. That is, the trim management component 113 can adjust the trims using a read-modify-write technique, by reading the current trim values, modifying the trims to get them back to the default value plus the newly identified trim values, and writing the new trim values. In some embodiments, the data structure 210 can include trim values relative to each other, rather than relative to the default values. Once the average PEC count transitions to from one set of values to the next, data will no longer be written with the prior set of values.

Referring to FIG. 2B, data structure 230 illustrates the writing trim set indicator 236 used by trim management component 113 to indicate which writing trim set was used to perform write operations directed to the various blocks within the memory sub-system 110. In some embodiments, the data structure can list each block in a memory sub-system, and the writing trim set indicator can indicate the writing trim set used for each block. As illustrated in FIG. 2B, the blocks within the memory device are grouped by superblock 232 and block family 234, and the writing trim set indicator 236 is maintained for each superblock 232. For example, memory sub-system 110 can use a striping scheme to distribute data throughout a subset of dies of a memory device 130. A set of blocks distributed across a set of dies of a memory device using a striping scheme can be referred to as a "superblock." The average PEC column 238 is used for illustration purposes only, and may not be included in data structure 230.

As example, as illustrated in FIG. 2B, trim management component 113 executed a write operation at superblock 232 "3" when the average PEC 238 count was "27." Hence, based on data structure 210 of FIG. 2A, because the average PEC count is less than 30, trim management component 113 used the trim values included in writing trim set "1" to perform the write operation. Trim management component 113 can update the writing trim set 236 column to indicate that writing trim set "1" was used.

When the trim management component 113 receives a read request directed to a block within the memory device, the trim management component 113 can determine the appropriate read offset values to apply based on the writing trim set 236 value for the superblock 232 associated with the block to be read. For example, the trim management component 113 can receive a read operation directed a block associated with superblock 232 "9." The trim management component 113 can determine that the data was previously written to superblock "9" using writing trim set "2." Hence, trim management component 113 can use data structure 210 of FIG. 2A to identify the trim values associated with writing trim set "2," and can determine the appropriate read offset values to apply to adjust for the trim values used when the data was written. In some implementations, the trim management component 113 can apply the read offset values in addition to other read offset values used in other error avoidance mechanisms (e.g., the error avoidance techniques used to mitigate error associated with the identified block family 234). That is, the read offset values can be additive.

Figure 3A:
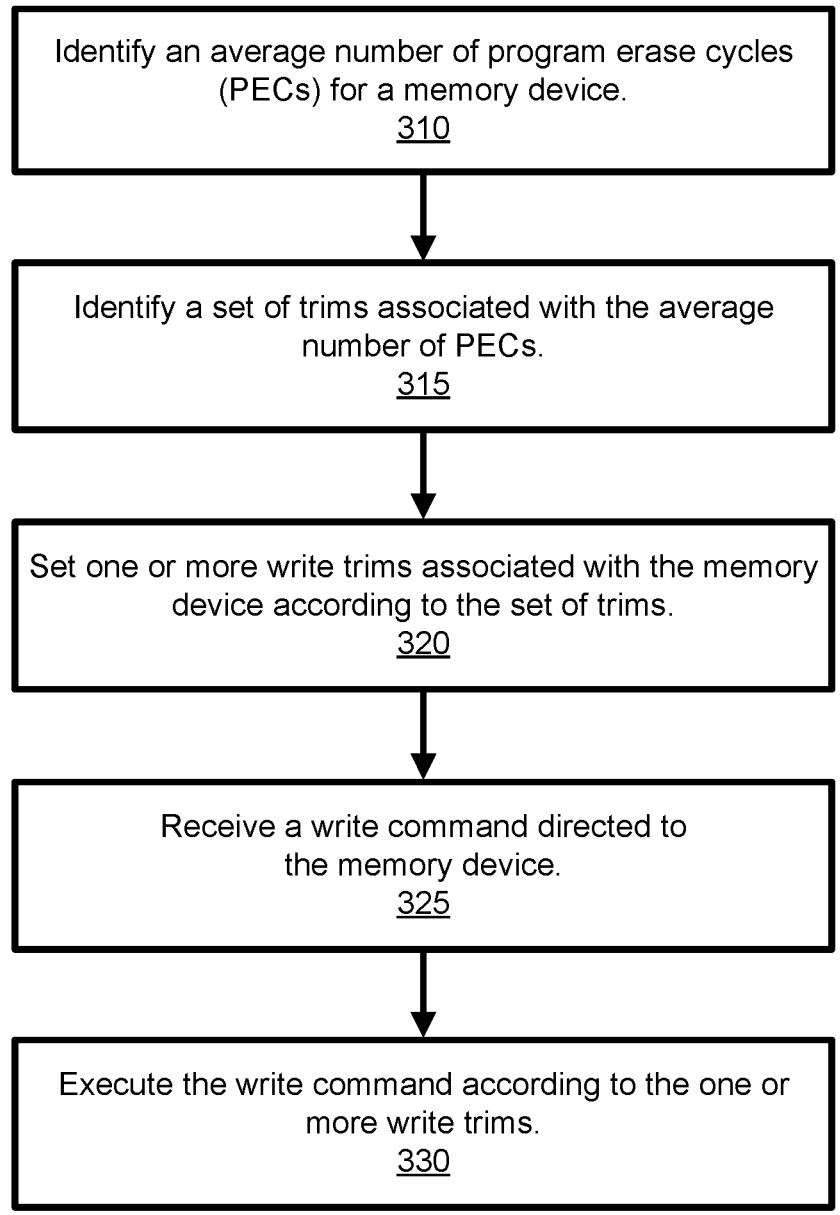
FIG. 3A is a flow diagram of an example method to adaptively shift the write trims based on an average number of program erase cycles (PECs) of a memory device, in accordance with some embodiments of the present disclosure.
Figure 3B:
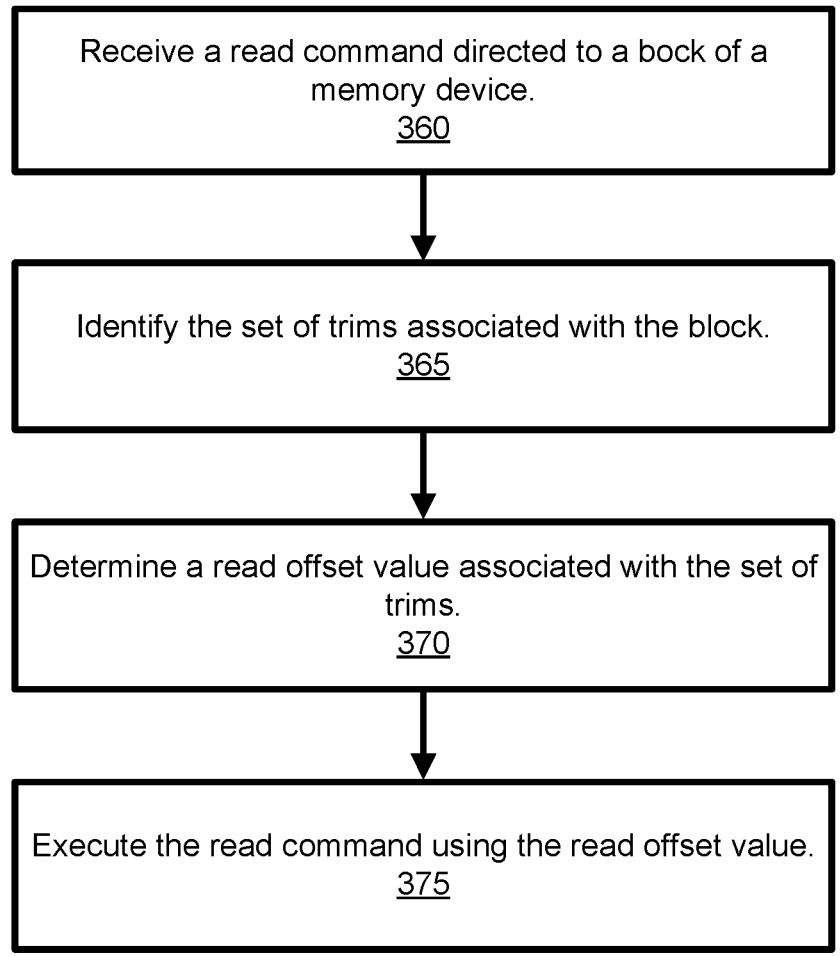
FIG. 3B is a flow diagram of an example method to read data from a memory device to which data was written using varied write trims, in accordance with some embodiments of the present disclosure.
Figure 4:
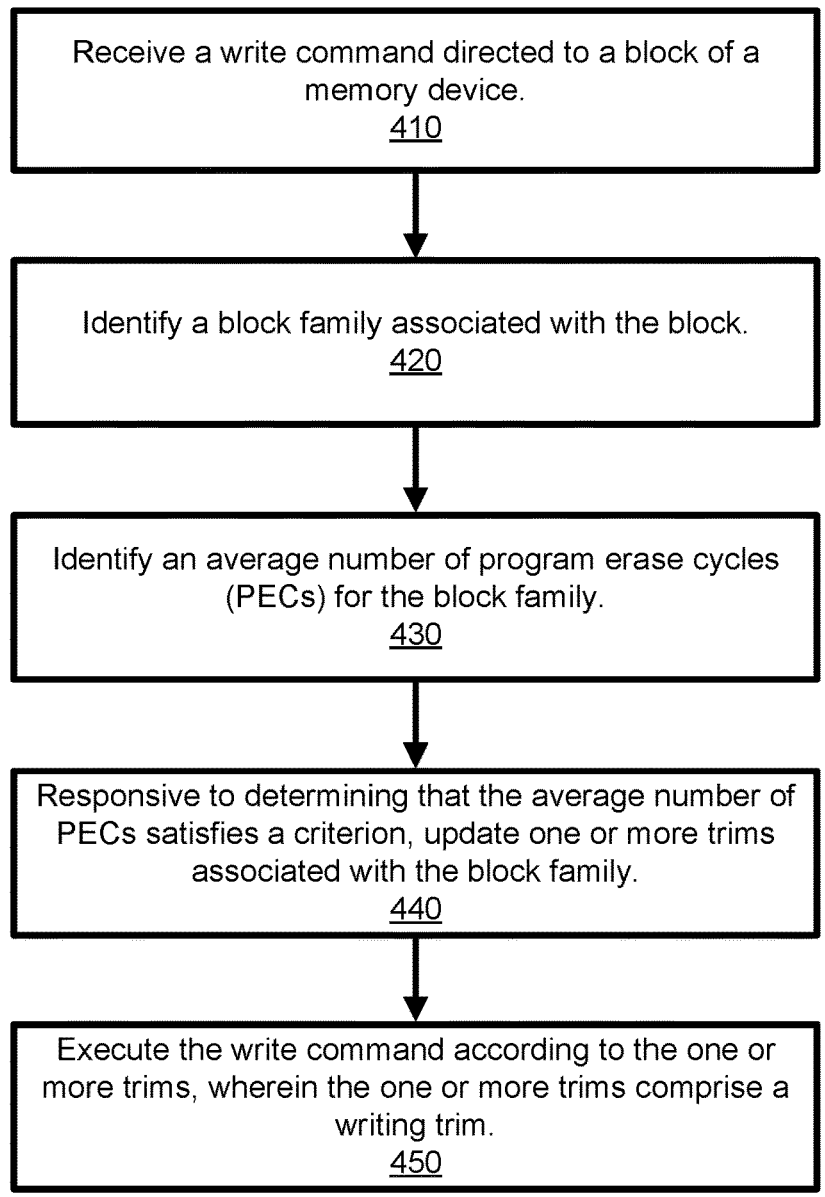
FIG. 4 is a flow diagram of an example method to adaptively shift the write trims based on an average number of program erase cycles (PECs) of a block family, in accordance with some embodiments of the present disclosure.

FIGS. 3A and 4 are a flow diagrams of example methods 300 and 400 to adaptively shift the write trims based on the average number of PECs, in accordance with some embodiments of the present disclosure. FIG. 3B is a flow diagram of an example method 350 to read data from a memory device to which data was written using varied write trims, in accordance with some embodiments of the present disclosure. Methods 300, 350, and/or 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, methods 300, 350, and/or 400 are performed by the trim management component 113 of FIG. 1, and can be performed responsive to a power on event and/or at a predetermined time interval (e.g., every hour, every x number of hours, every day, and/or every y number of days, etc.). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring to method 300 of FIG. 3A, at operation 310, the processing logic identifies an average number of program erase cycles (PECs) for a memory device. In embodiments, a memory sub-system controller can maintain a count of the number of PECs for each block. The memory sub-system controller can then determine the average number of PECs for the memory device. In embodiments, the processing logic can determine the average number of PECs for groups of blocks, such as superblocks or block families. In some embodiments, the memory sub-system controller can determine the average number of PECs for the memory sub-system as a whole. For illustrative purposes, the processing logic in method 300 identifies the average number of PECs for a memory device, however in various embodiments, the processing logic can identify the average number of PECs for the memory device, for groups of blocks in the memory device, and/or for the memory sub-system as a whole.

At operation 315, the processing logic identifies a set of trims associated with the average number of PECs. In some embodiments, identifying the set of trims associated with the average number of PECs includes identifying an entry in a first data structure, such as data structure 210 illustrated in FIG. 2A. The processing logic can then identify the set of trims associated with the entry in the first data structure. For example, the processing logic can identify one of three writing trim set entries in data structure 210 based on the average number of the PECs (e.g., writing trim set 1 for an average PEC count of less than 30, writing trim set 2 for an average PEC count of greater than or equal 30 and less than 1,000, or writing trim set 0 for an average PEC count of greater than or equal to 1,000). It should be noted that any number of writing trim sets can be used. As another example, the processing logic can identify one of five writing trim set entries based on the average number of PECs (e.g., writing trim set 1 for an average PEC count of less than 30, writing trim set 2 for an average PEC count of between 30 and 500, writing trim set 3 for an average PEC count of between 501 and 1,000, writing trim set 4 for an average PEC count of between 1,001 and 2,000, and writing trim set 0 for an average PEC count of above 2,001).

At operation 320, the processing logic sets one or more write trims associated with the memory device according to the set of trims. For example, using data structure 210 illustrated in FIG. 2A as an example, the processing logic can set the trims listed in column 212 to the values in column 214, 216, or 218, depending on the average number of PECs for the memory device. In embodiments, the number of sets of trims can be less than or more than three. To set the trims for the memory device to the values associated with the set of trims, the processing logic can instruct the memory sub-system controller to apply the trims listed the data structure to all write commands performed on the memory device.

At operation 325, the processing logic receives a write command directed to the memory device. The write command can be received from a host (e.g., host system 120 in FIG. 1), or can be received from the memory sub-system controller (e.g., to perform garbage collection, to perform error recovery operations, etc.). The write command can include a payload and a target address. The target address can be a logical block address associated with the memory device. The processing logic can translate the target logical block address to a physical block address, for example using a logical to physical translation table. The physical block address can point to a block within the memory device.

At operation 330, the processing logic executes the write command according to the one or more write trims. That is, the processing logic performs the write command using the trims identified in the data structure associated with the average number of PECs for the memory device. The processing logic can further update an entry in a second data structure to indicate the set of trims associated with the execution of the write command. In embodiments, the second data structure can include an entry for each block, or for groups of blocks (e.g., block sets, superblock sets, block families, or some other group of blocks). Each entry in the data structure can include a few bits (e.g., up to a byte) to indicate the writing trim set used to store data at the associated block or group of blocks. For example, the indicator can be a "1" to indicate that write command was executed using the first set of writing trim values, the indicator can be a "2" to indicate that the write command was executed using the second set of trim values, and the indicator can be a "0" to indicate that the write command was executed using the third set of trim values.

An example of the second data structure is described with regard to FIG. 2B. Using data structure 230 of FIG. 2B as an example, in embodiments, the processing logic can identify the superblock 232 associated with the target address included in the write command. The processing logic can then update the entry in the data structure 230 associated with the identified superblock 232 to include an indication of which writing trim set 236 was used to perform the write command. For example, using FIGS. 2A and 2B as examples, if the target address associated with the write command points to a block associated with superblock 232 "1," and the average number of PECs 238 at the time the write command is executed is 25, the processing logic can update the writing trim set entry 236 in the second data structure 230 with a value of "1" to indicate that the data was stored to the block using the first writing trim set in data structure 210.

Referring to method 350 of FIG. 3B, at operation 360, the processing logic receives a read command directed to a block of a memory device. The read command can be received from a host (e.g., host system 120 in FIG. 1), or can be received from the memory sub-system controller (e.g., to perform a background media scan, to measure for charge loss including power-on scans, to perform a read disturb scan, to perform garbage collection, and/or to perform error recovery operations). The read command can include an address of the data to be read, and a length that indicates the amount of the data to be read. The address included in the read command can be a logical block address, and the processing logic can translate the logical block address to a physical block address, e.g., using a logical to physical translation table. The address included in the read command can be directed to a block or a group of blocks within the memory device.

At operation 365, the processing logic identifies the set of trims associated with the block. In embodiments, the processing logic can identify an entry in a second data structure associated with the block, e.g., in data structure 230 of FIG. 2B. In embodiments, the second data structure can list the set of trims that were used when data was written to blocks, or to groups of blocks (e.g., block sets, superblock sets, block families, or some other group of blocks). The processing logic can identify a group of blocks associated with the block, and can identify the associated entry in the second data structure. For example, using data structure 230 of FIG. 2B as an example, if the read command is directed to superblock 232 "7," the processing logic can identify that the data was written to superblock "7" using the writing trim set 236 "2."

At operation 370, the processing logic determines a read offset value associated with the set of trims. In embodiments, the processing logic can identify an entry in a first data structure associated with the set of trims, and can determine a read offset value associated with the one or more trim values in the entry. An example of the first data structure is described with regard to FIG. 2A. Using data structure 210 in FIG. 2A as an example, the processing logic can identify the entry in the data structure associated with the set of trims. To continue the example above, if the read command is directed to superblock "7" and the processing logic identified the writing trim set "2" in data structure 230, the processing logic can identify column 216 in data structure 210 as listing the trim values associated with writing trim set "2." The processing logic can then determine the read offset value(s) to apply to match the trim values listed in column 216. For example, if the data to be read is stored at base level 5 of the memory cell, the processing logic can identify the read offset necessary to the shift of −20 DACs used when the data was written to the memory cell.

At operation 375, the processing logic executes the read command using the read offset value. In embodiments, responsive to determining that the writing trim set is not the default trim set (e.g., is not writing trim set "0"), the processing logic can execute the read command by applying a read offset value to offset the trim values used when the data was written to the block. In embodiments, the processing logic can execute an additional read command ahead of each read command to additively apply the read offsets associated with the writing trim set to existing read offset values. If the processing determines that the writing trim set used is the default writing trim set (e.g., illustrated as column 218 in FIG. 2A), the processing logic can determine to execute the read command without any additional read offset values.

Referring to method 400 of FIG. 4, at operation 410, the processing logic receives a write command directed to a block of a memory device. The write command can be received from a host (e.g., host system 120 in FIG. 1), or can be received from the memory sub-system controller (e.g., to perform garbage collection, to perform error recovery operations, etc.). The write command can include a target address directed to the block and a payload to be stored at the target address. In embodiments, the target address can be a logical block address, and the processing logic can translate the logical block address to a physical block address, e.g., using a logical to physical translation data structure.

At operation 420, the processing logic identifies a block family associated with the block. In embodiments, a block family can be a set of blocks that have been programmed within a specified time window and a specified temperature window. Block families can be created asynchronously with respect to block programming events. For example, a new block family can be created when a specified period of time has elapsed since creation of the last block family, and/or the reference temperature of memory cells has changed by more than specified threshold value. The memory sub-system controller can maintain a data structure that associates blocks with block families.

At operation 430, the processing logic identifies an average number of program erase cycles (PECs) for the block family. In embodiments, the memory sub-system controller can maintain a count of the number of PECs for each block. The memory sub-system controller can then determine the average number of PECs for each block family by determining the average number of PECs for the blocks associated with each block family.

At operation 440, responsive to determining that the average number of PECs satisfies a criterion, the processing logic sets one or more trims associated with the block family. The one or more trims can include a writing trim or a set of writing trims (e.g., writing trims for levels 1-7 as illustrated in table 210 of FIG. 2A). In embodiments, the criterion can be associated with a predetermined threshold value. For example, the average number of PECs can satisfy the criterion when the average number of PECs is equal to or exceeds the threshold value. In some embodiments, the criterion can be associated with a predetermined number of PECs, and the average number of PECs can satisfy the criterion when the average number of PECs is a multiple of the predetermined number of PECs (e.g., the criterion is satisfied every x number of PECs, where x is the predetermined number of PECs). In some embodiments, the criterion can be satisfied when the average number of PECs matches or exceeds a value in a data structure, such as the first data structure 210 illustrated in FIG. 2A.

The processing logic can set the one or more trims associated with the block family by identifying an entry in the first data structure associated with the average number of PECs, and can identify the set of trims associated with the entry. The processing logic can then set the one or more trims associated with the block family to the set of trims associated with entry. For example, using data structure 210 illustrated in FIG. 2A as an example, the processing logic can set the trims listed in column 212 to the values in column 214, 216, or 218, depending on the average number of PECs. In embodiments, the number of sets of trims can be fewer than or more than three. To set the trims for the memory device to the values associated with the set of trims, the processing logic can instruct the memory sub-system controller to apply the trims listed the data structure to all write commands performed on the block family.

At operation 450, the processing logic executes the write command according to the one or more trims. In embodiments, the processing logic can update an entry in a second data structure (e.g., data structure 230 of FIG. 2B) to indicate the set of trims associated with the execution of the write command. In embodiments, the second data structure can include an entry for each block family, and each entry can include an indicator that indicates the writing trim set used to store data at the block family.

In embodiments, the processing logic further receives a read command directed to the block of the memory device. The read command can include a target address referencing the block and length of data to be read. In embodiments, the target address can be a logical block address, and the processing logic can translate the logical block address to a physical block address using a logical to physical data structure.

The processing logic can identify the set of trims associated with the block to which the read command is directed. The processing logic can identify the set of trims by identifying an entry associated with the block family in the second data structure (e.g., data structure 230 of FIG. 2B). The entry in the data structure includes the set of trims that were used when data was written to the identified block.

The processing logic can then determine a read offset value associated with the set of trims. In embodiments, the processing logic can identify an entry associated with the set of trims in a first data structure (e.g., data structure 210 of FIG. 2A). The entry can list various trims for the set of trims, and the processing logic can determine read offset values associated with the one or more trim values in the entry to offset the trim values used to store the data at the block.

The processing logic can then execute the read command using the read offset value. In embodiments, responsive to determining that the writing trim set is not the default trim set, the processing logic can execute the read command by applying a read offset value to match the trim values used when the data was written to the block. In embodiments, the processing logic can execute an additional read command ahead of each read command to additively apply the read offsets associated with the writing trim set to existing read offset values. If the processing determines that the writing trim set used is the default writing trim set (e.g., illustrated as column 218 in FIG. 2A), the processing logic can determine to execute the read command without any additional read offset values.

Figure 5:
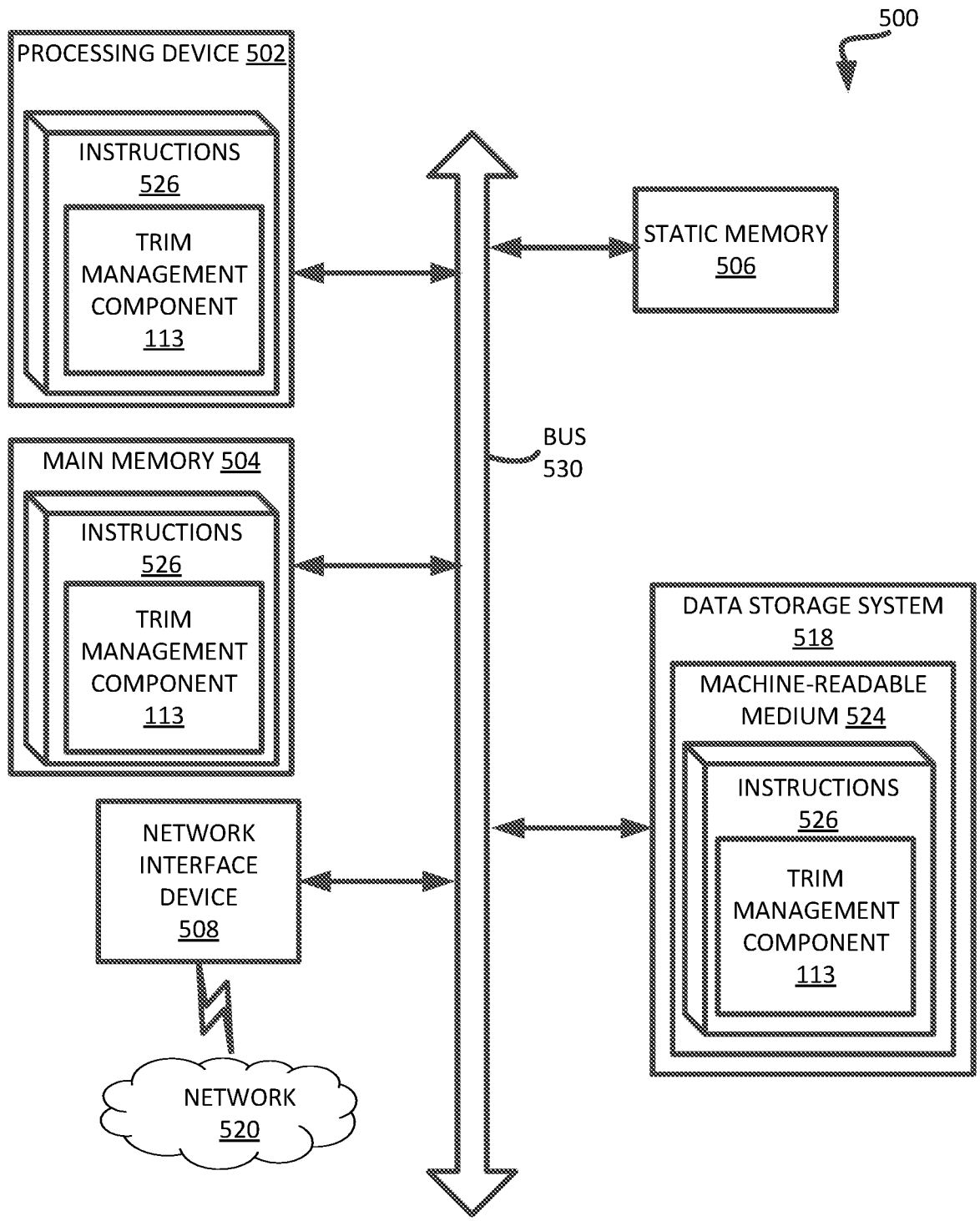
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the trim management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a trim management component (e.g., the trim management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
setting one or more trim values associated with a set of blocks of the memory device according to a representative number of program erase cycles (PECs) for the set of blocks, wherein each programmed block in the set of blocks was programmed within at least one of: a specified time window or a specified temperature range;
responsive to executing a program operation on a block of the set of blocks according to the one or more trim values, setting an indicator to reflect the one or more trim values used during the execution of the program operation;
responsive to receiving a request to perform a read operation directed to the block of the set of blocks, determining a read offset value corresponding to the indicator; and
executing the read operation using the read offset value.

2. The system of claim 1, wherein the representative number of PECs comprises an average number of PECS for the set of blocks.

3. The system of claim 1, wherein determining the read offset value corresponding to the indicator comprises:
identifying an entry in a data structure associated with the indicator; and
determining the read offset value associated with the indicator from the entry.

4. The system of claim 1, wherein the processing device is to perform operations further comprising:
identifying an entry in a data structure, wherein the entry is associated with the representative number of PECs; and identifying a set of trims associated with the entry in the data structure, wherein the set of trims comprises the one or more trim values.

5. The system of claim 1, wherein the processing device is to perform operations further comprising:
updating an entry in a data structure to indicate the one or more trim values associated with the execution of the program operation.

6. The system of claim 1, wherein the operations are performed responsive to at least one of: a power on event of the system, or a predetermined time interval.

7. The system of claim 1, wherein the one or more trim values comprise at least one of: an erase trim, a voltage programming trim, or a base trim associated with a threshold voltage distribution of a cell of the memory device.

8. A method comprising:
setting one or more trim values associated with a set of blocks of a memory device according to a representative number of program erase cycles (PECs) for the set of blocks, wherein each programmed block in the set of blocks was programmed within at least one of: a specified time window or a specified temperature range;
responsive to executing a program operation on a block of the set of blocks according to the one or more trim values, setting an indicator to reflect the one or more trim values used during the execution of the program operation;
responsive to receiving a request to perform a read operation directed to the block of the set of blocks, determining a read offset value corresponding to the indicator; and
executing the read operation using the read offset value.

9. The method of claim 8, wherein the representative number of PECs comprises an average number of PECs for the set of blocks.

10. The method of claim 8, wherein determining the read offset value corresponding to the indicator comprises:
identifying an entry in a data structure associated with the indicator; and
determining the read offset value associated with the indicator from the entry.

11. The method of claim 8, further comprising:
identifying an entry in a data structure, wherein the entry is associated with the representative number of PECs; and
identifying a set of trims associated with the entry in the data structure, wherein the set of trims comprises the one or more trim values.

12. The method of claim 8, further comprising:
updating an entry in a data structure to indicate a one or more trim values associated with the execution of the program operation.

13. The method of claim 8, wherein the one or more trim values comprise at least one of: an erase trim, a voltage programming trim, or a base trim associated with a threshold voltage distribution of a cell of the memory device.

14. A non-transitory computer-readable storage medium comprising instructions that, when executed by a processing device, cause the processing device to perform operations comprising:
setting one or more trim values associated with a set of blocks of a memory device according to a representative number of program erase cycles (PECs) for the set of blocks, wherein each programmed block in the set of blocks was programmed within at least one of: a specified time window or a specified temperature range;
responsive to executing a program operation on a block of the set of blocks according to the one or more trim values, setting an indicator to reflect the one or more trim values used during the execution of the program operation;
responsive to receiving a request to perform a read operation directed to the block of the set of blocks, determining a read offset value corresponding to the indicator; and
executing the read operation using the read offset value.

15. The non-transitory computer-readable storage medium of claim 14, wherein the representative number of PECs comprises an average number of PECs for the set of blocks.

16. The non-transitory computer-readable storage medium of claim 14, wherein determining the read offset value corresponding to the indicator comprises:
identifying an entry in a data structure associated with the indicator; and
determining the read offset value associated with the indicator from the entry.

17. The non-transitory computer-readable storage medium of claim 14, wherein the processing device is to perform operations further comprising:
identifying an entry in a data structure, wherein the entry is associated with the representative number of PECs; and
identifying a set of trims associated with the entry in the data structure, wherein the set of trims comprises the one or more trim values.

18. The non-transitory computer-readable storage medium of claim 14, wherein the processing device is to perform operations further comprising:
updating an entry in a data structure to indicate the one or more trim values associated with the execution of the program operation.

19. The non-transitory computer-readable storage medium of claim 14, wherein the operations are performed responsive to at least one of: a power on event of the memory device, or a predetermined time interval.

20. The non-transitory computer-readable storage medium of claim 14, wherein the one or more trim values comprise at least one of: an erase trim, a voltage programming trim, or a base trim associated with a threshold voltage distribution of a cell of the memory device.

* * * * *